United States Patent
Shirasu et al.

(10) Patent No.: US 7,907,017 B2
(45) Date of Patent: Mar. 15, 2011

(54) PHASE LOCKED LOOP CIRCUIT THAT LOCKS THE OSCILLATION FREQUENCY TO A TARGET FREQUENCY

(75) Inventors: Hideki Shirasu, Gunma (JP); Norio Kobayashi, Gunma (JP); Kouji Miyauchi, Gunma (JP)

(73) Assignee: Advantest Corporation, Tokyo (JP)

( * ) Notice: Subject to any disclaimer, the term of this patent is extended or adjusted under 35 U.S.C. 154(b) by 834 days.

(21) Appl. No.: 11/813,640

(22) PCT Filed: Jan. 16, 2006

(86) PCT No.: PCT/JP2006/300898
§ 371 (c)(1),
(2), (4) Date: Aug. 16, 2007

(87) PCT Pub. No.: WO2006/077992
PCT Pub. Date: Jul. 27, 2006

(65) Prior Publication Data
US 2009/0004985 A1    Jan. 1, 2009

(30) Foreign Application Priority Data
Jan. 20, 2005    (JP) .................... 2005-013138

(51) Int. Cl.
*H03L 7/001* (2006.01)

(52) U.S. Cl. ......... 331/16; 331/34; 331/177 R; 327/156; 455/260

(58) Field of Classification Search .................. 331/16, 331/17, 34, 177 R; 327/156; 455/260
See application file for complete search history.

(56) References Cited

U.S. PATENT DOCUMENTS
5,461,344 A * 10/1995 Andoh ...................... 331/1 A
2006/0279363 A1   12/2006 Shirasu FOREIGN PATENT DOCUMENTS
JP         6-152404         5/1994
JP         2000-40959       2/2000
JP         2005-341024      12/2005

OTHER PUBLICATIONS

English language Abstract of JP 2005-341024.
English language Abstract of JP 6-152404.
English language Abstract of JP 2000-40959.

\* cited by examiner

*Primary Examiner* — Arnold Kinkead
(74) *Attorney, Agent, or Firm* — Greenblum & Bernstein P.L.C.

(57) ABSTRACT

In a PLL circuit, an oscillation frequency is quickly and accurately locked to a target frequency. There is provided a PLL circuit, including a VCO that controls the frequency of an output signal according to a voltage of an input signal, a loop divider that divides the frequency of a signal, which is acquired by causing a mixer to mix a local signal generated by a local oscillator and the output signal with each other, by N, and a reference frequency divider that divides the frequency of a reference signal, which is output by a reference signal oscillator, by R. Also provided is a phase comparator that outputs a signal according to a difference in phase between an output of the loop divider and an output of the reference frequency divider, a loop filter that passes low frequency components, and supplies the VCO with the low frequency components, a subtractor that outputs a difference between a voltage of the input signal to be supplied to the VCO so that the frequency coincides with a target value and the output of the loop filter, and switches that supply the loop filter with the output of the phase comparator or the output of the subtractor.

4 Claims, 4 Drawing Sheets

US 7,907,017 B2

PHASE LOCKED LOOP CIRCUIT THAT LOCKS THE OSCILLATION FREQUENCY TO A TARGET FREQUENCY

TECHNICAL FIELD

The present invention relates to a PLL (Phase Locked Loop) circuit.

BACKGROUND ART

A PLL (phase locked loop) circuit has conventionally been used for a frequency synthesizer and a spectrum analyzer (refer to Patent Document 1: Japanese Laid-Open Patent Publication (Kokai) No. 2000-40959 (FIG. 1, FIG. 4, and ABSTRACT)). The PLL circuit includes a voltage-controlled oscillator (VCO) and a loop filter as is generally known.

In order to quickly lock an oscillation frequency of the voltage-controlled oscillator to a target frequency, a D/A converter is used for pre-tuning (Refer to Patent Document 1). Specifically, data of a voltage to be impressed on the voltage-controlled oscillator so that the voltage-controlled oscillator oscillates at the target frequency is converted into an analog voltage by the D/A converter, is added to the output of a loop filter, and is then impressed on the voltage-controlled oscillator (for example refer to FIG. 4 of Patent Document 1). By means of the pre-tuning, the oscillation frequency can be close to the target frequency. After the pre-tuning, it is possible to quickly lock the oscillation frequency to the target frequency as a result of a normal operation of the PLL circuit.

In order to more quickly lock the oscillation frequency to the target frequency, the gain of the loop filter may be increased.

DISCLOSURE OF THE INVENTION

However, if the gain of the loop filter is increased, an output voltage range of the loop filter increases. The maximum output voltage of the loop filter cannot thus be neglected. By means of the pre-tuning, the oscillation frequency is a sum of a neighborhood of the target frequency and a frequency corresponding to the maximum output voltage of the loop filter in a more strict sense. Since the maximum output voltage of the loop filter cannot be neglected, and the normal operation of the PLL circuit starts from the frequency fairly displaced from the target frequency, the oscillation frequency cannot be locked to the target frequency quickly. Moreover, an output of the voltage-controlled oscillator may be mixed with a local signal, is frequency-divided, and is then supplied to a phase comparator. In this case, if the polarity of the oscillation frequency is inverted with respect to the local signal after the pre-tuning, the oscillation frequency will not be locked to the target frequency.

If the loop filter is stopped upon the pre-tuning (refer to FIG. 1 and ABSTRACT of Patent Document 1), this problem will not occur. However, if the loop filter is not used for the pre-tuning, the oscillation frequency will deviate from the target frequency (due to the operation temperature and the like) even though the pre-tuning is carried out.

It is an object of the present invention to quickly and accurately lock the oscillation frequency to the target frequency in a PLL circuit.

According to an aspect of the present invention, a signal processing device includes: a voltage-controlled oscillating unit that controls a frequency of an output signal according to a voltage of an input signal; a loop dividing unit that divides a frequency of a signal obtained based on the output signal by N (N is a real number, which is equal to or greater than one); a reference frequency dividing unit that divides a frequency of a reference signal by R (R is a real number, which is equal to or greater than one); a phase comparison unit that outputs a signal according to a difference in phase between an output of the loop dividing unit and an output of the reference frequency dividing unit; a low-pass filter that passes a low frequency component, and supplies the voltage-controlled oscillating unit with the low frequency component; a difference output unit that outputs a difference between a voltage of the input signal, which is to be supplied to the voltage-controlled oscillating unit so that the frequency of the output signal coincides with a target value, and an output of the low-pass filter; and a switching unit that supplies the low-pass filter with an output of the phase comparison unit or an output of the difference output unit.

According to the thus constructed signal processing device, a voltage-controlled oscillating unit controls a frequency of an output signal according to a voltage of an input signal. A loop dividing unit divides a frequency of a signal obtained based on the output signal by N (N is a real number, and is equal to or greater than one). A reference frequency dividing unit divides a frequency of a reference signal by R (R is a real number, and is equal to or greater than one). A phase comparison unit outputs a signal according to a difference in phase between an output of the loop dividing unit and an output of the reference frequency dividing unit. A low-pass filter passes a low frequency component, and supplies the voltage-controlled oscillating unit with the low frequency component. A difference output unit outputs a difference between a voltage of the input signal, which is to be supplied to the voltage-controlled oscillating unit so that the frequency of the output signal coincides with a target value, and an output of the low-pass filter. A switching unit supplies the low-pass filter with an output of the phase comparison unit or an output of the difference output unit.

According to the signal processing device of the present invention, the switching unit supplies the low-pass filter with the output of the difference output unit, and then supplies the low-pass filter with the output of the phase comparison unit when the frequency of the output signal has settled.

According to the signal processing device of the present invention, the loop dividing unit divides a frequency of a signal, which is acquired by mixing the output signal with a local signal, by N.

BEST MODE FOR CARRYING OUT THE INVENTION

A description will now be given of an embodiment of the present invention with reference to drawings.

Figure 1:
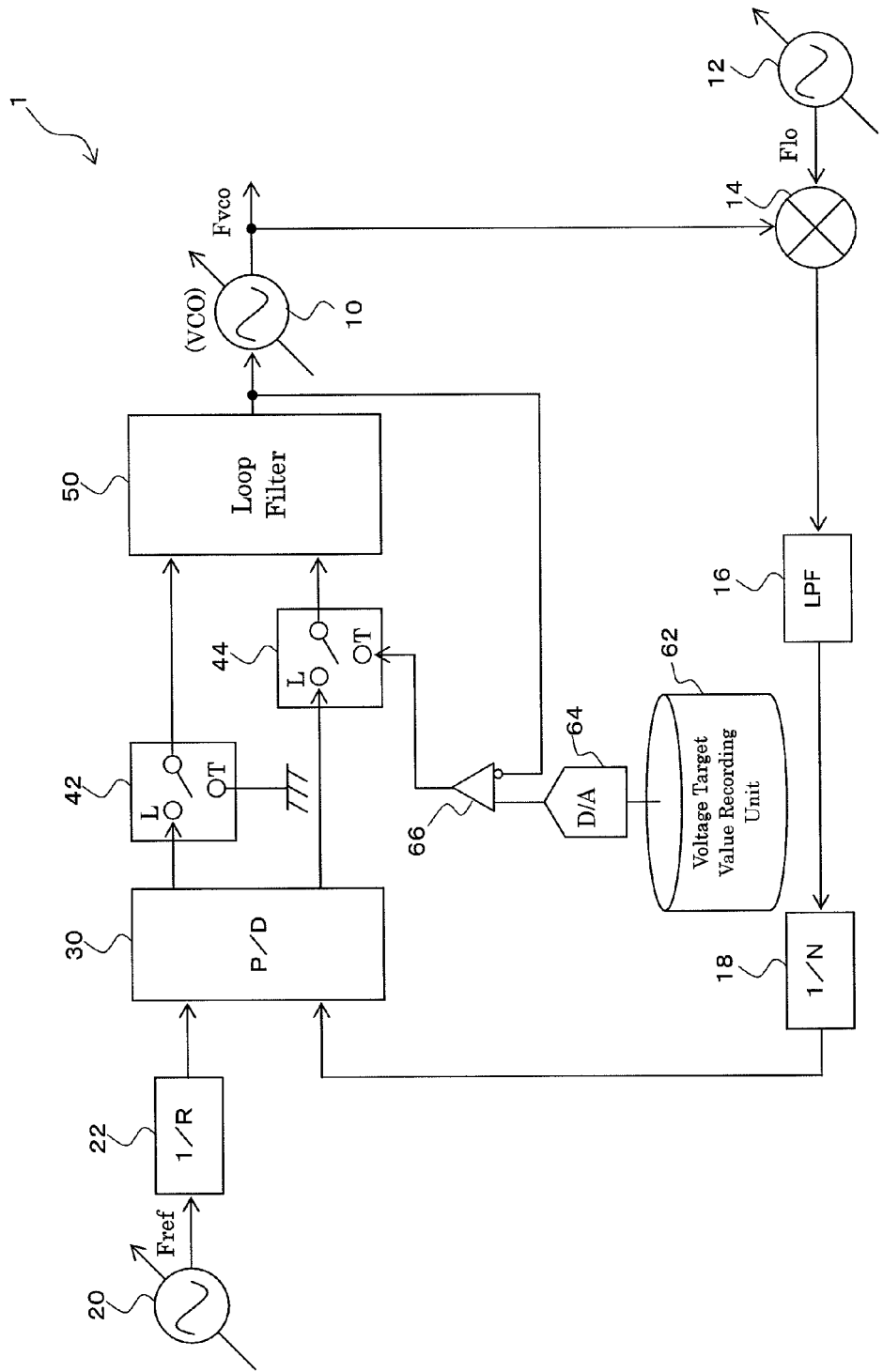
FIG. 1 is a block diagram showing a configuration of a PLL circuit (signal processing device) 1 according an embodiment of the present invention.

FIG. 1 is a block diagram showing a configuration of a PLL circuit (signal processing device) 1 according the embodiment of the present invention. The PLL circuit 1 includes a voltage-controlled oscillator (VCO) 10, a local oscillator 12, a mixer 14, a low-pass filter 16, a loop divider 18, a reference signal oscillator 20, a reference frequency divider 22, a phase comparator 30, switches (switching means) 42, 44, a loop filter (low-pass filter) 50, a voltage target value recording unit 62, a D/A converter 64, and a subtractor (difference output means) 66.

The PLL circuit 1 provides control that the frequency Fvco of an output signal of the voltage-controlled oscillator 10 coincides with a predetermined target value Ft.

The voltage-controlled oscillator (VCO) 10 controls the frequency Fvco of the output signal according to the voltage of an input signal.

The local oscillator 12 outputs a local signal (frequency Flo). The mixer 14 mixes the output signal output by the voltage-controlled oscillator 10 and the local signal with each other by multiplying them by each other. The low-pass filter 16 passes low frequency components of an output of the mixer 14. The loop divider 18 divides the frequency of an output of the low-pass filter 16 by N (N is a real number, and is equal to or greater than one).

The reference signal oscillator 20 outputs a reference signal (frequency: Fref). The reference frequency divider 22 divides the frequency of the reference signal by R (R is a real number, and is equal to or greater than one), and outputs the frequency-divided signal.

N and R are usually integers. However, if the loop divider 18 and the reference frequency divider 22 are direct digital synthesizers (DDSes) or fractional dividers, N and R may be real numbers other than integers.

The phase comparator 30 outputs a signal according to a difference in phase between the output of the loop divider 18 and the output of the reference frequency divider 22. If the phase of the output of the reference frequency divider 22 is leading the phase of the output of the loop divider 18, the phase comparator 30 outputs a control signal having a duty ratio according to the phase difference to the switch 42. If the phase of the output of the reference frequency divider 22 is lagging behind the phase of the output of the loop divider 18, the phase comparator 30 outputs a control signal having a duty ratio according to the phase difference to the switch 44.

The switch (switching means) 42 receives the control signal output by the phase comparator 30 at a terminal L. A terminal T is grounded. The switch (switching means) 42 supplies the loop filter 50 with the signal received at the terminal L or the terminal T.

The switch (switching means) 44 receives the control signal output by the phase comparator 30 at a terminal L. The switch 44 receives an output of the subtractor 66 at a terminal T. The switch (switching means) 44 supplies the loop filter 50 with the signal received at the terminal L or the terminal T.

The switch 42 and the switch 44 first supply the loop filter 50 with the signal received at the terminal T. The frequency Fvco of the output signal of the voltage-controlled oscillator 10 then settles to a neighborhood of the predetermined target value Ft. The switch 42 and the switch 44 then supply the loop filter 50 with the signal received at the terminal L.

The loop filter (low-pass filter) 50 passes low frequency components of the outputs of the switch 42 and the switch 44, and supplies the voltage-controlled oscillator 10 with the low frequency components.

Figure 2:
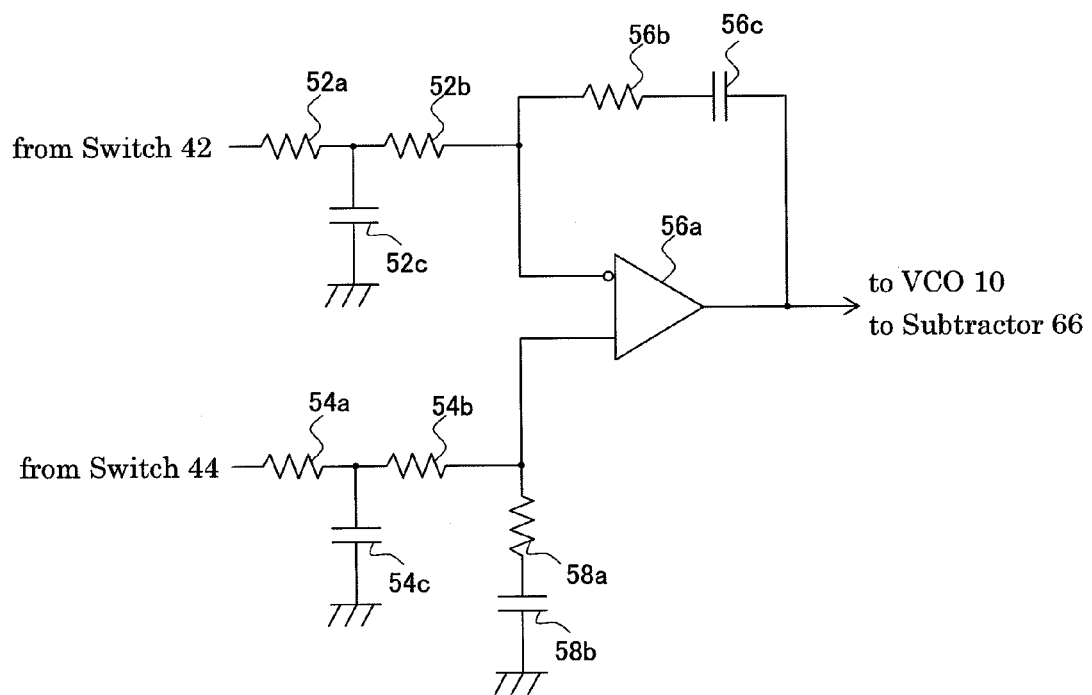
FIG. 2 is a circuit diagram of a loop filter 50.

FIG. 2 is a circuit diagram of the loop filter 50. The loop filter 50 is a well-known loop filter, and includes resisters 52a, 52b, 54a, 54b, 56b, 58a, capacitors 52c, 54c, 56c, 58b, and a differential amplifier 56a.

One end of the resistor 52a is connected to the switch 42. The other end of the resistor 52a is connected to one end of the resistor 52b and one end of the capacitor 52c. The other end of the capacitor 52c is grounded.

One end of the resistor 54a is connected to the switch 44. The other end of the resistor 54a is connected to one end of the resistor 54b and one end of the capacitor 54c. The other end of the capacitor 54c is grounded.

One end of the resistor 58a and one end of the capacitor 58b are connected with each other, and the other end of the capacitor 58b is grounded.

The differential amplifier 56a has two input terminals and one output terminal. The differential amplifier 56a amplifies a difference between voltages input to the two input terminals, and outputs the amplified difference from the output terminal. The output of the differential amplifier 56a is supplied to the voltage-controlled oscillator 10 and the subtractor 66.

The output terminal of the differential amplifier 56a is connected also to one end of the capacitor 56c, and one end of the resistor 56b is connected to the other end of the capacitor 56c.

The other end of the resistor 52b and the other end of the resistor 56b are connected to one of the input terminals of the differential amplifier 56a.

The other end of the resistor 58a and the other end of the resistor 54b are connected to the other one of the input terminals of the differential amplifier 56a.

The voltage target value recording unit 62 records a voltage Vt of an input signal to be supplied to the voltage-controlled oscillator 10 as digital data so that the frequency Fvco of the output signal of the voltage-controlled oscillator 10 reaches the target value Ft.

The D/A converter 64 converts the voltage Vt recorded in the voltage target value recording unit 62 into analog data. The analog data output by the D/A converter 64 is an analog signal at the voltage Vt.

The subtractor (difference output means) 66 outputs a difference in voltage between the voltage Vt of the analog signal output by the D/A converter 64 and the voltage output by the loop filter 50. The output of the subtractor 66 is supplied to the switch 44.

A description will now be given of an operation of the embodiment of the present invention.

It is assumed that the frequency Fvco of the output signal of the voltage-controlled oscillator 10 in the PLL circuit 1 is Fs. On this occasion, the pre-tuning (refer to FIG. 3) is carried out to settle the Fvco to the neighborhood of the predetermined target value Ft. The normal operation (lock) of the PLL circuit 1 is then carried out (refer to FIG. 4) to settle the Fvco to the predetermined target value Ft.

(1) Pre-Tuning

Figure 3:
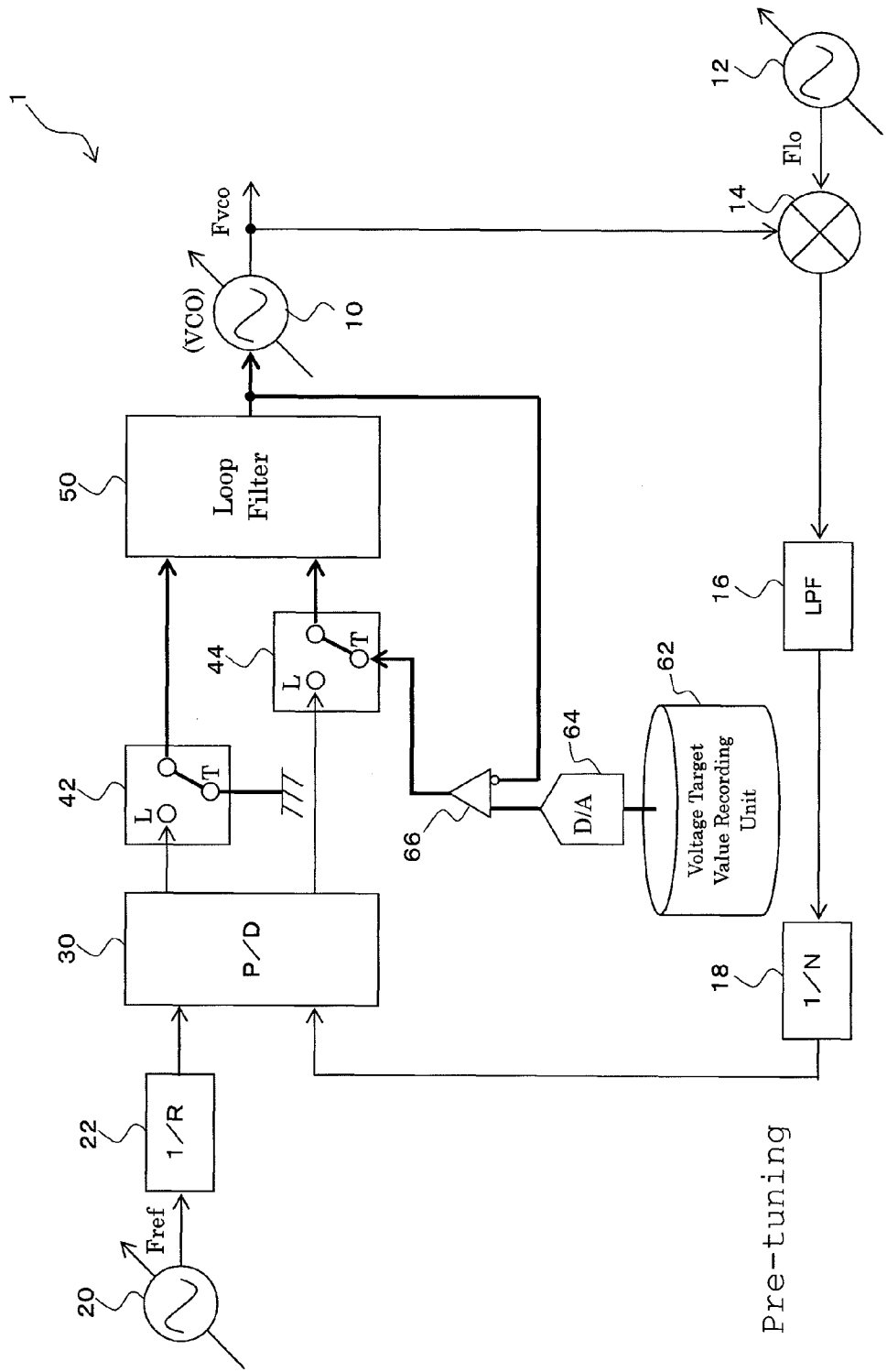
FIG. 3 shows a configuration of the PLL circuit 1 during pre-tuning.

FIG. 3 shows a configuration of the PLL circuit 1 during pre-tuning. When Fvco=Fs, the switch 42 and the switch 44 are switched to the terminal T. In other words, the switch 42 impresses the ground electrical potential to the loop filter 50, and the switch 44 supplies the loop filter 50 with the output of the subtractor 66.

The loop filter 50 passes the low frequency components of the output of the subtractor 66. The output of the loop filter 50 is fed to the subtractor 66. The voltage Vt (voltage of an input signal to be fed to the voltage-controlled oscillator 10 so that the frequency Fvco of the output signal of the voltage-controlled oscillator 10 settles to the target value Ft) of the analog signal output by the D/A converter 64 is also fed to the subtractor 66.

The subtractor 66 outputs the difference between the voltage Vt of the analog signal output by the D/A converter 64 and the voltage output by the loop filter 50. The output of the subtractor 66 is fed to the switch 44.

The switch 42, the switch 44, the loop filter 50, the voltage target value recording unit 62, the D/A converter 64, and the subtractor 66 form a feedback loop. As a result, the output of the loop filter 50 becomes equal to the voltage Vt of the analog signal output by the D/A converter 64, and settles.

The output of the loop filter 50 is fed to the voltage-controlled oscillator 10. If the output voltage of the loop filter 50 settles to the voltage Vt, the frequency Fvco of the output signal of the voltage-controlled oscillator 10 reaches the target value Ft. It should be noted that the Fvco=Ft is not perfectly attained due to an error of the voltage-controlled oscillator 10, an error in the recorded content of the voltage target value recording unit 62, and the like, and the Fvco settles to the neighborhood of the target value Ft.

If the gain of the loop filter 50 is increased, the output of the loop filter 50 settles quickly. Even if the gain of the loop filter 50 increases more, the output of the loop filter 50 does not necessarily deviate from the voltage Vt.

(2) Lock

Figure 4:
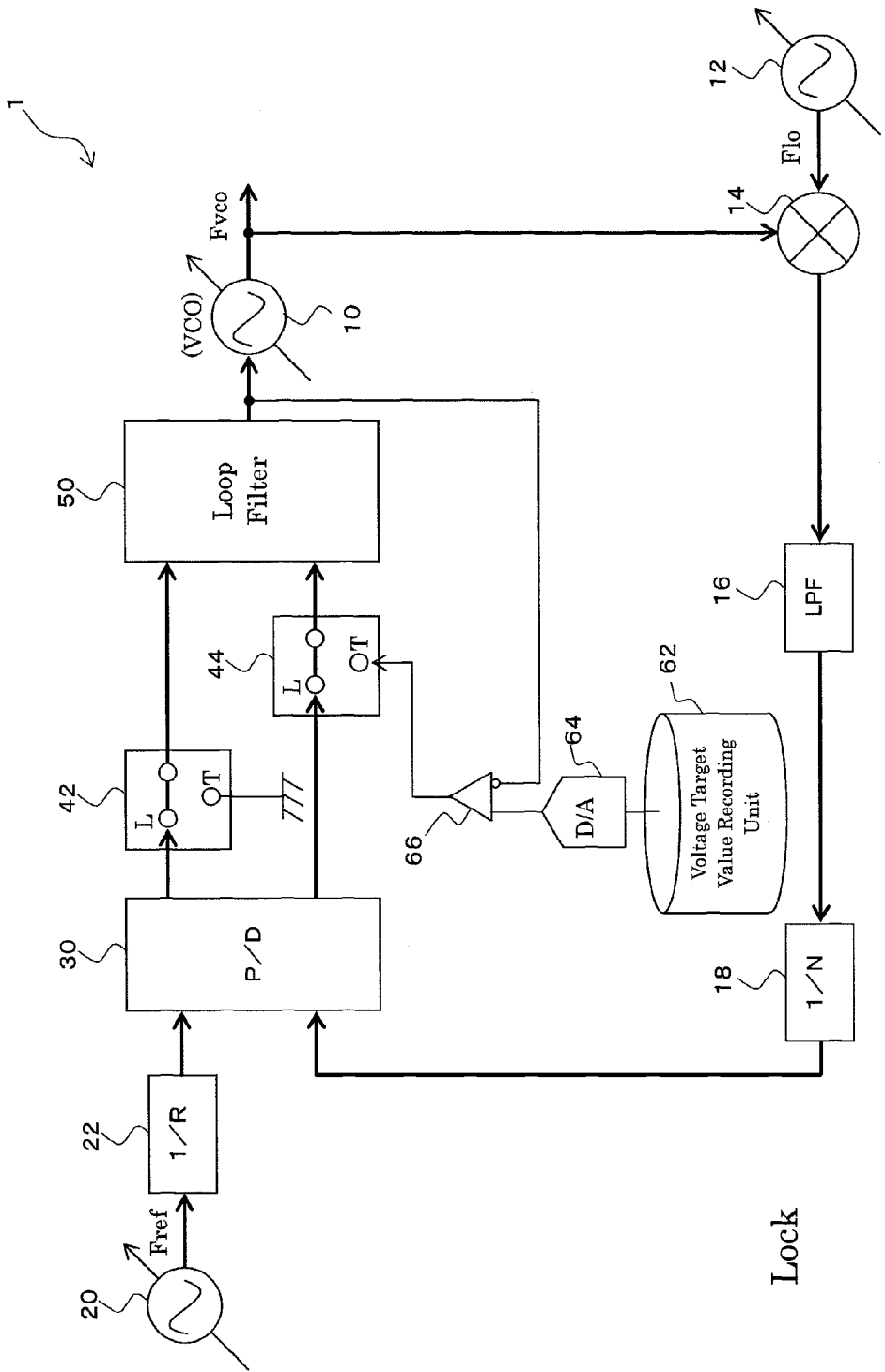
FIG. 4 shows a configuration of the PLL circuit 1 during a normal operation (lock) of the PLL circuit 1.

FIG. 4 shows a configuration of the PLL circuit 1 during a normal operation (lock) of the PLL circuit 1. After the Fvco settles to the neighborhood of the target value Ft as a result of the "(1) Pre-tuning", the switch 42 and the switch 44 are switched to the terminal L. Namely, the switch 42 and the switch 44 supply the loop filter 50 with the output of the phase comparator 30.

The loop filter 50 passes the low frequency components of the output of the phase comparator 30. The output of the loop filter 50 is fed to the voltage-controlled oscillator 10.

The voltage-controlled oscillator 10 outputs the output signal at the frequency of Fvco. The local oscillator 12 outputs the local signal (frequency Flo). The mixer 14 mixes the output signal output by the voltage-controlled oscillator 10 and the local signal with each other by multiplying them by each other. The low-pass filter 16 passes the low frequency components of the output of the mixer 14. These low frequency components are frequency-divided by the divider 18 by N, and is fed to the phase comparator 30.

Moreover, the reference signal oscillator 20 outputs the reference signal at the frequency of Fref. The output signal is frequency-divided by the frequency divider 22 by R, becomes the signal at the frequency of Fref/R, and is fed to the phase comparator 30.

The phase comparator 30 outputs a signal according to the difference in phase between the output of the loop divider 18 and the output of the reference frequency divider 22. If the phase of the output of the reference frequency divider 22 is leading the phase of the output of the loop divider 18, the phase comparator 30 outputs the control signal having the duty ratio according to the phase difference to the switch 42. If the phase of the output of the reference frequency divider 22 is lagging behind the phase of the output of the loop divider 18, the phase comparator 30 outputs a control signal having a duty ratio according to the phase difference to the switch 44.

This is the normal operation of the PLL circuit. Fvco is locked to Fvco=Flo+Fref×N/R or Fvco=Flo−Fref×N/R, and settles. To which value Fvco settles depends on the polarity of the phase comparator 30. It should be noted that Flo+Fref×N/R or Flo−Fref×N/R is the target value Ft.

Since the Fvco is settled to the neighborhood of the target value Ft, the normal operation of the PLL circuit starts. Thus, Fvco quickly settles to the target value Ft.

If the normal operation of the PLL circuit starts from a state where the Fvco is settled to the opposite polarity with respect to Flo, Fvco will not settle to the target vale Ft. In other words, if Fvco is settled and Fvco<Flo as a result of the "(1) Pre-tuning" while Ft=Flo+Fref×N/R, or if Fvco is settled and Fvco>Flo as a result of the "(1) Pre-tuning" while Ft=Flo−Fref×N/R, the Fvco will not settle to the target value Ft.

However, Fvco is settled to the neighborhood of the target value Ft due to the "(1) Pre-tuning", Fvco is settled with a polarity which is not inverted with respect to the Flo. The normal operation of the PLL circuit starts from this state, and the Fvco thus settles to the target value Ft.

According to the embodiment of the present invention, it is possible to quickly and accurately lock Fvco to Ft in the PLL circuit 1.

In other words, the switch 42, the switch 44, the loop filter 50, the voltage target value recording unit 62, the D/A converter 64, and the subtractor 66 form a feedback loop in the "(1) Pre-tuning". As a result, the output of the loop filter 50 coincide with the voltage Vt of the analog signal output by the D/A converter 64, and settles.

Compared with a case where the output of the D/A converter 64 is fed to the loop filter 50, and the feedback loop is not used, the embodiment of the present invention employs the feedback loop, and the output of the loop filter 50 more accurately settles to the voltage Vt of the analog signal output by the D/A converter 64.

Moreover, according to the embodiment of the present invention, if the gain of the loop filter 50 is increased in the "(1) Pre-tuning", the output of the loop-filter 50 will not be displaced by the maximum output voltage of the loop-filter 50. It is thus possible to quickly settle the output of the loop filter 50 by increasing the gain of the loop filter 50.

Further more, Fvco settles to the neighborhood of the target value Ft due to the "(1) Pre-tuning", and it is thus possible to more quickly lock Fvco to Ft by means of the normal operation (lock) of the PLL circuit 1 subsequently.

It should be noted that a configuration without local oscillator 12 is conceivable. In this case, the mixer 14 and the low-pass filter 16 are removed, and the output of the voltage-controlled oscillator 10 is fed to the loop divider 18.

The invention claimed is:

1. A signal processing device, comprising:
    a voltage-controlled oscillator that controls a frequency of an output signal according to a voltage of an input signal;
    a loop divider that divides a frequency of a signal obtained based on the output signal by N (N is a real number, and is equal to or greater than one);
    a reference frequency divider that divides a frequency of a reference signal by R (R is a real number, and is equal to or greater than one);
    a phase comparator that outputs a signal according to a difference in phase between an output of said loop divider and an output of said reference frequency divider;
    a low-pass filter that passes a low frequency component, and supplies said voltage-controlled oscillator with the low frequency component;
    a difference outputter that outputs a difference between a voltage of the input signal, which is to be supplied to said voltage-controlled oscillator so that the frequency of the output signal coincides with a target value, and an output of the low-pass filter; and
    a switch that supplies said low-pass filter with an output of said phase comparator or an output of said difference outputter,
    wherein the input signal supplied to the difference outputter is supplied by a voltage target value recorder and has a same target voltage as the target voltage of the input signal supplied to the voltage-controlled oscillator.

2. The signal processing device according to claim 1, wherein said switch supplies said low-pass filter with the output of said difference outputter, and then supplies said low-pass filter with the output of said phase comparator when the frequency of the output signal has settled.

3. The signal processing device according to claim 1, wherein said loop divider divides a frequency of a signal, which is acquired by mixing the output signal with a local signal, by N.

4. The signal processing device according to claim 2, wherein said loop divider divides a frequency of a signal, which is acquired by mixing the output signal with a local signal, by N.

* * * * *